US005430481A

United States Patent [19]
Hynecek

[11] Patent Number: 5,430,481
[45] Date of Patent: Jul. 4, 1995

[54] MULTIMODE FRAME TRANSFER IMAGE SENSOR

[75] Inventor: Jaroslav Hynecek, Richardson, Tex.

[73] Assignee: Texas Instruments Incorporated, Dallas, Tex.

[21] Appl. No.: 220,145

[22] Filed: Mar. 30, 1994

[51] Int. Cl.⁶ .......................................... H04N 5/335
[52] U.S. Cl. ...................................... 348/317; 348/322
[58] Field of Search .............. 348/314, 311, 312, 316, 348/322, 321, 324, 230, 220, 319, 317, 322; 257/248, 245; H04N 5/335

[56] References Cited

U.S. PATENT DOCUMENTS

| 4,229,752 | 10/1980 | Hynecek | 357/24 |
| 4,837,630 | 6/1989 | Ueda | 348/319 |
| 4,878,121 | 10/1989 | Hynecek | 358/213.22 |
| 4,995,061 | 2/1991 | Hynecek | 257/245 |
| 5,019,911 | 5/1991 | Ohino et al. | 348/220 |
| 5,151,380 | 9/1992 | Hynecek | 437/53 |
| 5,216,489 | 6/1993 | Yonemoto et al. | 257/245 |

OTHER PUBLICATIONS

A Channel-Stop Defined Barrier and Drain Antiblooming Structure for Virtual Phase CCD Image Sensors, W. F. Keenan, et al., IEEE Transaction on Electron Devices, vol. No. 36, Sep. 1989.

Virtual Phase Technology: A New Approach to Fabircation of Large Area CCDS, Jaroslaw Hynecek, Reprinted from IEEE Transactions on Electron Devices, vol. ED-28, No. 5, May 1981.

*Primary Examiner*—Donald J. Yusko
*Assistant Examiner*—Michael Day
*Attorney, Agent, or Firm*—Alan K. Stewart; Richard L. Donaldson; William E. Hiller

[57] ABSTRACT

The imager includes a frame transfer image array 22 having a plurality of image cells, the image cells accumulating charge in response to input light and arranged in a plurality of image rows and image columns, odd numbered ones of the image rows constituting a first field and even numbered ones of the image rows constituting a second field; and a memory array 24 having a plurality of memory cells arranged in a plurality of memory rows and memory columns for storing charge from the image array 22, wherein, in a first mode, charge in the first field and the second field is transferred to the memory array 24 from the image array, and, in a second mode, charge in the first field is summed with charge in the second field in the image array 22 before being transferred to the memory array 24.

15 Claims, 4 Drawing Sheets

MULTIMODE FRAME TRANSFER IMAGE SENSOR

CROSS REFERENCE TO RELATED APPLICATIONS

U.S. application Ser. No. 08/220,087.

FIELD OF THE INVENTION

This invention relates generally to image sensors, and more specifically to multimode image sensors which operate in both interlace and non-interlace modes.

BACKGROUND OF THE INVENTION

In the National Television Standards Committee (NTSC) television system, the television picture adapted for solid state sensors is comprised by a plurality of image pixels arranged in horizontal parallel rows. The image is divided into a field "A" and a field "B". The odd lines, lines 1, 3, 5, etc., are first scanned and displayed in a field "A". After field "A" has been scanned, the even lines, lines 2, 4, 6, etc., are scanned and displayed in a field "B". Field "A" is said to be interlaced with field "B".

The time separation of field "A" and field "B" in the above recording scheme creates a difficulty when an image sensor attempts to record a scene in the manner of still photography. To simulate still photography, it is necessary to take the exposure of both fields at the same time. However, for compatibility with the NTSC system and still picture storing method, the field "A" must be separately generated in the device from field "B" to facilitate the time sequential NTSC compatible display.

SUMMARY OF THE INVENTION

Generally, and in one form of the invention, an imager includes a frame transfer image array having a plurality of image cells, the image cells accumulating charge in response to input light and arranged in a plurality of image rows and image columns, odd numbered ones of the image rows constituting a first field and even numbered ones of the image rows constituting a second field; and a memory array having a plurality of memory cells arranged in a plurality of memory rows and memory columns for storing charge from the image array, wherein, in a first mode, charge in the first field and the second field is transferred to the memory array from the image array, and, in a second mode, charge in the first field is summed with charge in the second field in the image array before being transferred to the memory array.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

In the low cost (small size) image sensor family, such as ⅓ inch format, the preferred embodiment provides an image sensor which can operate in several modes: image capture of two TV fields simultaneously (still photography); movie mode of operation with interlace function; fast charge clearing mode, which allows electronic iris function; charge summing capability; smear subtraction for high performance black and white applications; and dual line readout for high resolution color sensing. All these modes of operation are achieved by the frame transfer architecture shown in FIG. 1.

Figure 1:
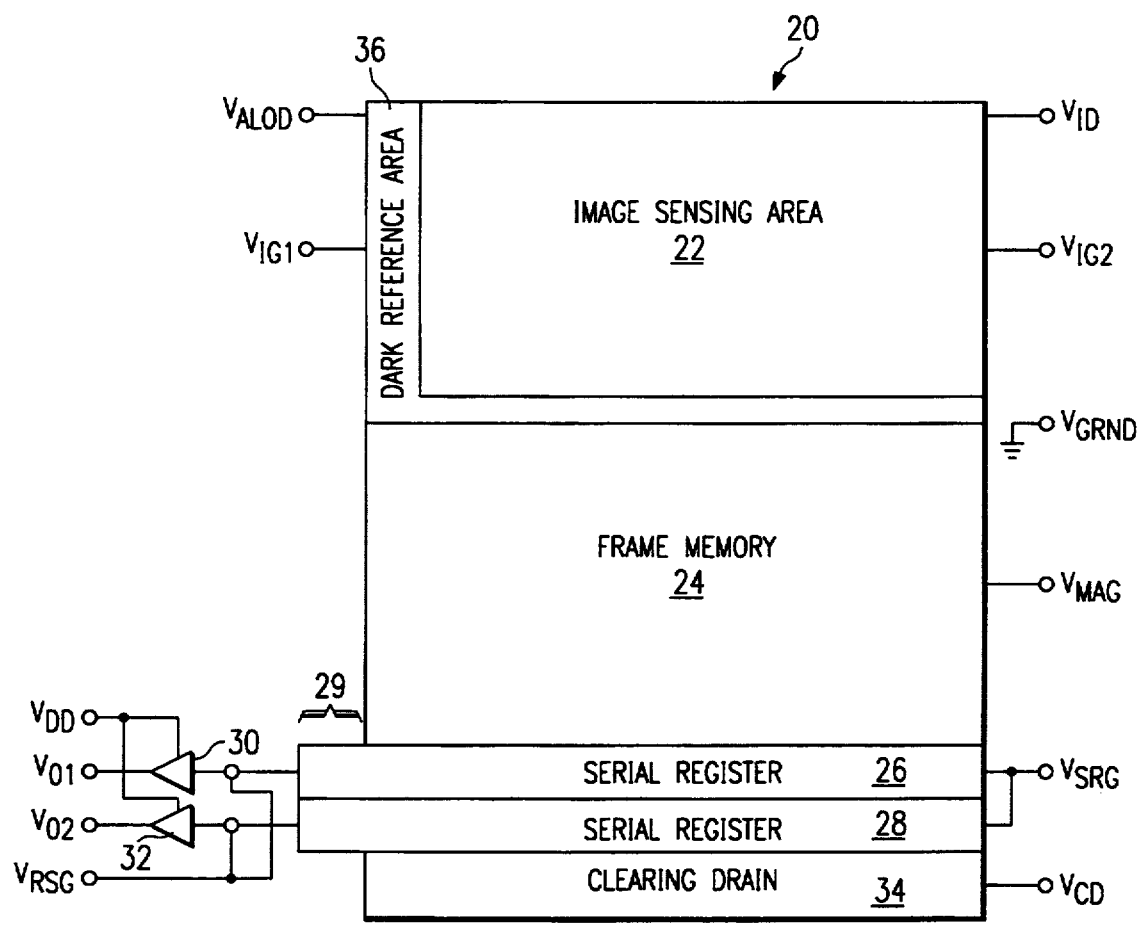
FIG. 1 is a schematic block diagram of a preferred embodiment imager.

A schematic block diagram representation of the basic sensor system architecture for the preferred embodiment frame transfer device is depicted generally at 20 in FIG. 1. The device 20 includes two phase image sensing area 22, single phase frame memory area 24, dual serial registers 26 and 28, charge detection amplifiers 30 and 32, bottom clearing drain 34, and 12 external connections. The 12 external connections include advanced lateral overflow drain (ALOD) clocked signal $V_{ALOD}$, first image area gate clocked signal $V_{IG1}$, charge detection amplifier drain bias $V_{DD}$, output from first serial register $V_{O1}$, output from second serial register $V_{O2}$, bottom clearing drain clocked signal $V_{CD}$, charge detection amplifier reset gate clocked signal $V_{RSG}$, serial register gate clocked signal $V_{SRG}$, chip substrate $V_{GRND}$, memory area gate clocked signal $V_{MAG}$, second image area gate clocked signal $V_{IG2}$, and input diode clocked signal $V_{ID}$. Only ten leads are necessary to operate the device. The input diode can be internally biased by a resistor to $V_{DD}$ and the clear drain can be internally biased by a transistor to $V_{DD}$.

In the preferred embodiment, the image sensing area 22 is composed of 500 lines from which 496 are active and 4 are dark reference lines covered by a light shield. The dark lines are located at the edge of the image sensing area 22 which interfaces with the frame memory 24, in order to provide isolation between the two regions. Each line has a total of 680 pixels from which 658 are active and 22 are shielded by a light shield. The dark pixels are located at the left edge of the image sensing area 22 in the dark reference area 36. The dark reference signal is utilized in the signal processing circuits of the output signal once it has left the image sensor 20 in a manner that is known in the art. There is an input diode located at the top edge of the image sensing area 22 which enables a fixed amount of charge to be input into the last dark reference column. This feature is important for the automated testing of the sensor 20.

The frame memory 24 of the preferred embodiment shown in FIG. 1 consists of 500 lines with 680 pixels in each line. The signal from the memory 24 is transferred in parallel into the dual serial registers 26 and 28. For readout, the odd lines in the memory can be transferred in parallel through the first serial register 26 and into the second serial register 28. When an odd line is shifted into the second serial register 28, an even line is shifted into the first serial register 26. The odd lines are then read out from the second serial register 28. The even lines are read out through the first serial register 26. Charge in the serial registers 26 and 28 can be either transported serially into the amplifiers 30 and 32 or emptied through the bottom clearing drain 34.

Serial registers 26 and 28, shown in FIG. 1, operate similarly to a column of the devices in memory area 24. Charge is moved from column to column instead of from row to row. This is accomplished by setting up a potential profile that channels the charge from one pixel area to an adjacent pixel area to the left of the first pixel area.

The amplifiers 30 and 32 receive charge from the serial registers 26 and 28 through an additional four dummy pixels which span the distance 29 from the edge of the memory.

The image area pixels of the device of FIG. 1 have been divided into two groups, field "A" and field "B". Field "A" contains the odd lines and field "B" contains the even lines. Charge can be integrated in 500 lines and transferred into the memory or it can be summed into 250 lines with every signal line followed by an empty line and then transferred into the memory. Each empty line can be used to collect smear information during the charge transfer which can be used later for subtraction. It is also necessary that the image area is completely cleared of any charge prior to charge integration. This is accomplished by using an advanced lateral overflow drain (ALOD) structure in each pixel. The ALOD can be pulsed high, which clears the charge from the image sensing area.

Figure 2:
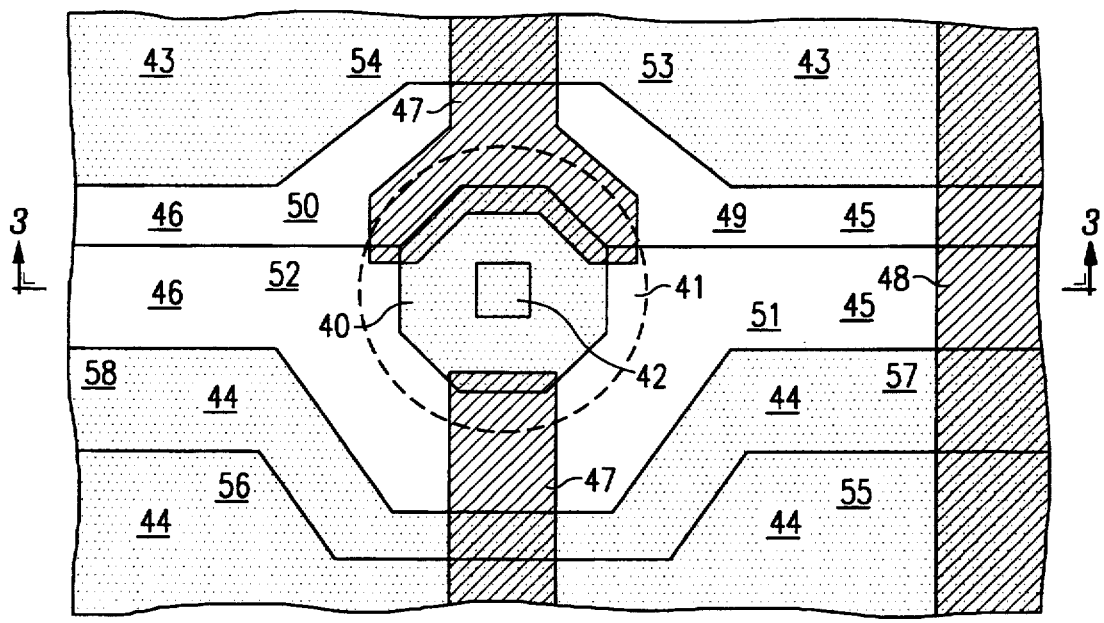
FIG. 2 is a plan view of the advanced lateral overflow drain of the preferred embodiment.

Referring to FIG. 2, a plan view of a first preferred embodiment advanced lateral overflow drain (ALOD) antiblooming structure is shown. The antiblooming structure shown in FIG. 2 includes drain electrode 40, threshold adjust implants 41, N+ region (drain) 42, clocked gates 43 and 44, virtual gates 45 and 46, channel stops 47 and 48, virtual barriers 49 and 50 below the virtual gates, virtual wells 51 and 52 below the virtual gates, clocked wells 53, 54, 55 and 56 below the clocked gates, and clocked barriers 57 and 58 below the clocked gates. The antiblooming structure is formed at a face of a P type semiconductor substrate or layer. The antiblooming structure is surrounded by virtual phase charge coupled device (CCD) cells arranged in a plurality of rows and columns. The semiconductor layer is preferably a semiconductor substrate, but can take other forms such as an epitaxial layer.

Figure 3:
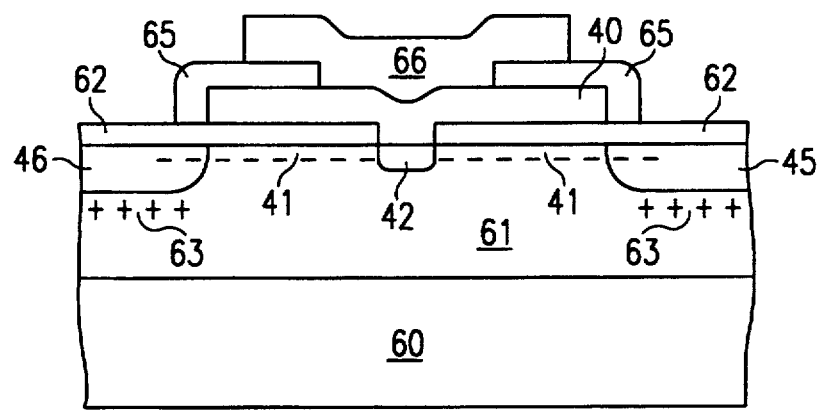
FIG. 3 is a cross sectional view of the advanced lateral overflow drain of the preferred embodiment.

FIG. 3 is a cross-section taken along the axis A—A' of the first preferred embodiment lateral overflow drain shown in FIG. 2. The structure of FIG. 3 includes a P type silicon layer 60, an N type layer 61 in the layer 60, P+ virtual gates 45 and 46 formed in the upper portion of N type layer 61, N+ drain (lateral drain) 42, gate insulator layer 62, drain electrode 40, virtual well donor implants 63 in the N type layer 61, threshold adjust implant 41 below the drain electrode 40, insulator layer 65, and drain interconnect (conductive interconnect) 66.

For image capture of two TV fields simultaneously, which is important for still photography, charge can be integrated in all 500 lines in the image sensing area 22 and transferred into the memory 24. In this mode, field "A", the odd numbered lines, is read out from serial register 28, and field "B", the even numbered lines, is read out from serial register 26 simultaneously.

For image capture of two interlaced TV fields nonsimultaneously, charge integrated in the 500 lines in the image sensing area 22 is summed into 250 lines with every signal line followed by an empty line. Charge summing is altered to provide both TV fields "A" and "B". For field "A", line 2 is summed with line one, line 4 is summed with line 3 , etc. For field "B", line 3 is summed with line 2 , line 5 is summed with line 4 , etc. This procedure accomplishes electronic centroid shift and thus electronic interlace.

Figure 4:
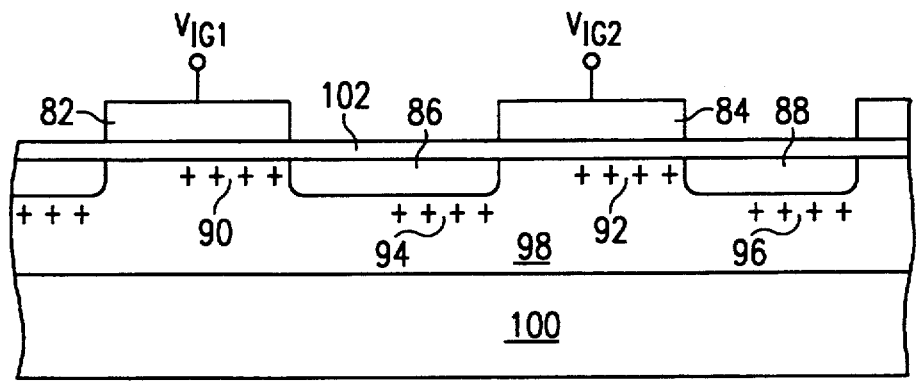
FIG. 4 is a cross sectional view of the virtual phase CCD pixel area of the preferred embodiment imager of FIG. 1.

The charge summing can best be described by referring to FIG. 4. A cross section of a virtual phase charge coupled device (CCD) is shown in FIG. 4. The cross section includes an odd and even pixel from the image sensing area 22 of FIG. 1. The direction of charge transfer in the device of FIG. 4 is from left to right. This corresponds with charge transfer in the direction from top to bottom in the image sensing area 22 of FIG. 1. The virtual phase CCD of FIG. 4 includes an odd gate 82, an even gate 84, virtual gates 86 and 88, donor implants 90, 92, 94, and 96, N type semiconductor region 98, P type semiconductor region 100, and insulator layer 102.

Figure 5:
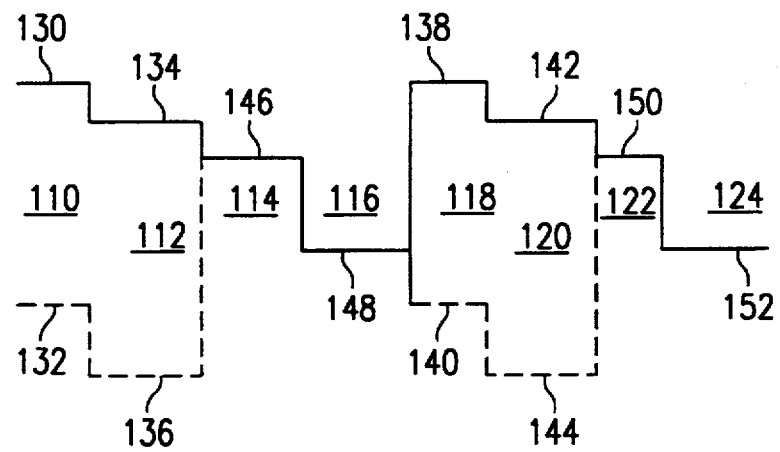
FIG. 5 is a potential diagram illustrating the operation of the device in FIG. 4 in moving charge from a first pixel area to an adjacent second pixel area.

FIG. 5 shows the potential levels for each region in the device of FIG. 4. The odd clocked well 110 and odd clocked barrier 112 are at potential levels 136 and 132 when the odd gate 82 is at a high potential level, and at potential levels 134 and 130 when the odd gate 82 is at a low potential level. The even clocked well 120 and even clocked barrier 118 are at potential levels 144 and 140 when the even gate 84 is at a high potential level, and at potential levels 142 and 138 when the even gate 84 is at a low potential level. The virtual barrier 114 is at potential level 146. The virtual well 116 is at potential level 148. The virtual barrier 122 is at potential level 150. The virtual well 124 is at potential level 152.

During charge integration, the odd gates and even gates are held at a low potential so that charge collects in the virtual wells. After the charge integration period, the charge summing is accomplished by pulsing either the odd gates or the even gates before the transfer into memory area 24, depending on whether field "A" or field "B" is desired. For example, if the odd gates are pulsed from low to high to low, charge in the virtual well adjacent the odd clocked barrier will be shifted to the next virtual well in the direction of charge transfer. This combines charge from the two virtual wells into one virtual well and leaves the other virtual well empty of image signal. Looking at FIG. 5, if the odd gate 82 is pulsed, the charge in the virtual well to the left of odd clocked barrier 110 will be shifted to virtual well 116 and combined with the charge in virtual well 116. Charge in virtual well 124 will be shifted to the next virtual well (not shown) to the right of virtual well 124. After charge has been summed into every other line, it is then transferred to the memory area 24 and read out. Then, after the next charge integration period, the even gates are pulsed instead of the odd gates to accomplish an electronic centroid shift to provide interlace. In this way, the interlaced fields "A" and "B" are provided for the NTSC system.

The charge summing technique described above also provides smear information. Smear is the result of charge generation in the imaging area during the transfer of charge between the imaging and memory sections of the device. When the charge summing is completed, every other line in the image sensing area is empty of image signal. When the image information is transferred from the image area to the memory area, smear can occur. The lines that contain no image information after charge summing will contain charge levels that are related to smear. The lines containing image information will also contain charge resulting from smear. The smear information in the empty lines can be used to determine the amount of smear in the lines containing image information. Since the smear information is contained in every other line in the memory, the smear information can be read out simultaneously with the corresponding image signal information by using the dual serial registers 26 and 28. For example, serial register 28 can be used to read the lines containing both image signal and smear information and serial register 26 can be used to read the lines containing only smear information. Subtraction of the smear information from the image signal can be accomplished by a differential amplifier off-chip on a pixel by pixel basis.

In case of color applications it is advantageous to use all 500 lines in the device with a particular "Beyer" color filter coding. In this case two lines of data are read in each TV field which allows the color image to be reconstructed with increased accuracy. For the first TV field "A", the first and second lines are read, then the third and fourth lines are read, then the fifth and sixth lines are read, etc. For the second TV field "B", the second and third lines are read, then the fourth and fifth lines are read, then the sixth and seventh lines are read, etc. Below are two examples of a section of a color filter pattern. Other patterns can also be used.

|   |   |   |   |   |   |   |
|---|---|---|---|---|---|---|
| G | B | G | B | G | B | G |
| R | G | R | G | R | G | R |
| G | B | G | B | G | B | G |
| R | G | R | G | R | G | R |
| G | B | G | R | G | B | G | R |
| B | G | R | G | B | G | R | G |
| G | R | G | B | G | R | G | B |
| R | G | B | G | R | G | B | G |

If all 500 lines are used for the color sensing, as described above, the smear subtraction function cannot be implemented. However, for a color stripe coding, with somewhat reduced color resolution, the smear subtraction can be enabled in the same way as described above using charge summing in the image sensing area. Other patterns with complementary color filter arrangements can also be used. They can be used in both modes, summed or not summed, to yield the color signal for NTSC.

Figure 6:
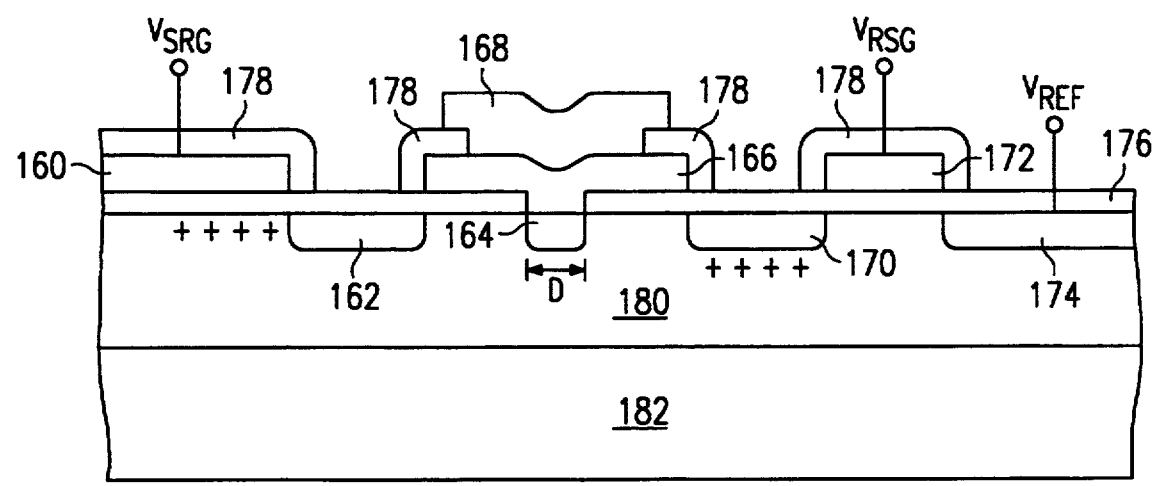
FIG. 6 is a cross-sectional view of the highly sensitive charge detection node in the preferred embodiment of FIG. 1.

Some of the design features used in the ALOD structure in the image sensing area are used to provide a highly sensitive charge detection node, as shown in FIG. 6. The device shown in FIG. 6 includes a clocked gate 160 and virtual gate 162 of a CCD channel, N+ region 164, polysilicon contact 166, metal contact 168 (charge detection node), virtual gate 170, reset gate 172, N+ reference charge drain 174, insulator layer 176, insulator layer 178, N type semiconductor region 180, P type semiconductor region 182, donor implants 184, and donor implants 186. The smaller N+ contact 164 makes the diode node smaller which increases sensitivity. In the preferred embodiment, the width D of the N+ region 164 is on the order of 0.5 microns. By using a separate reset gate 172 in the sense amplifier it is also possible to sum pixels horizontally for larger signal output when needed.

Figure 7:
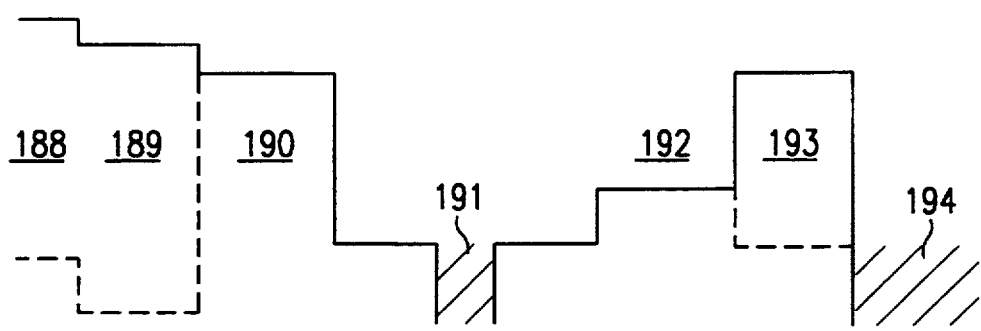
FIG. 7 is a potential diagram illustrating the operation of the device in FIG. 6.

FIG. 7 shows the potential levels for each region in the device of FIG. 6. The regions shown in FIG. 7 include clocked barrier 188, clocked well 189, virtual barrier 190, charge detection well 191, virtual well 192, reset barrier 193, and charge drain 194.

Figure 8:
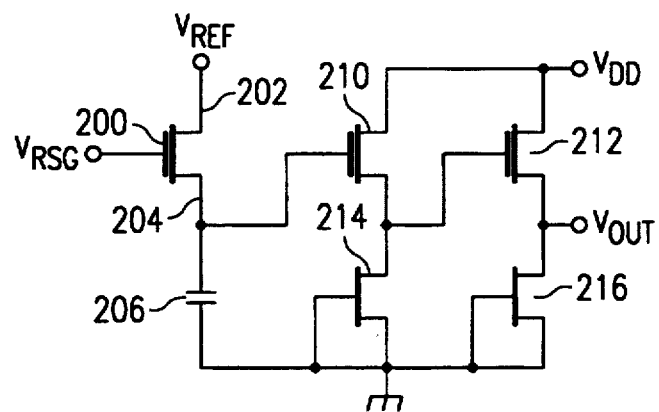
FIG. 8 is a circuit diagram of a preferred embodiment charge detection amplifier.

A preferred embodiment charge detection amplifier circuit is shown in FIG. 8. Reset gate 200 is the reset gate 172 shown in FIG. 6. Reference node 202 is the reference node 174 shown in FIG. 6. Charge detection node 204 is the charge detection node 168 shown in FIG. 6. Capacitor 206 is the capacitance between the charge detection node and the substrate. Transistors 210, 212, 214, and 216 form an amplifier circuit that amplifies the signal from the charge detection node 204. $V_{out}$ is the amplified output signal. $V_{DD}$ is the bias voltage for the amplifier circuit. $V_{REF}$ is the reference voltage for the detection node generated on chip by a reference voltage generator from $V_{DD}$.

Figure 9:
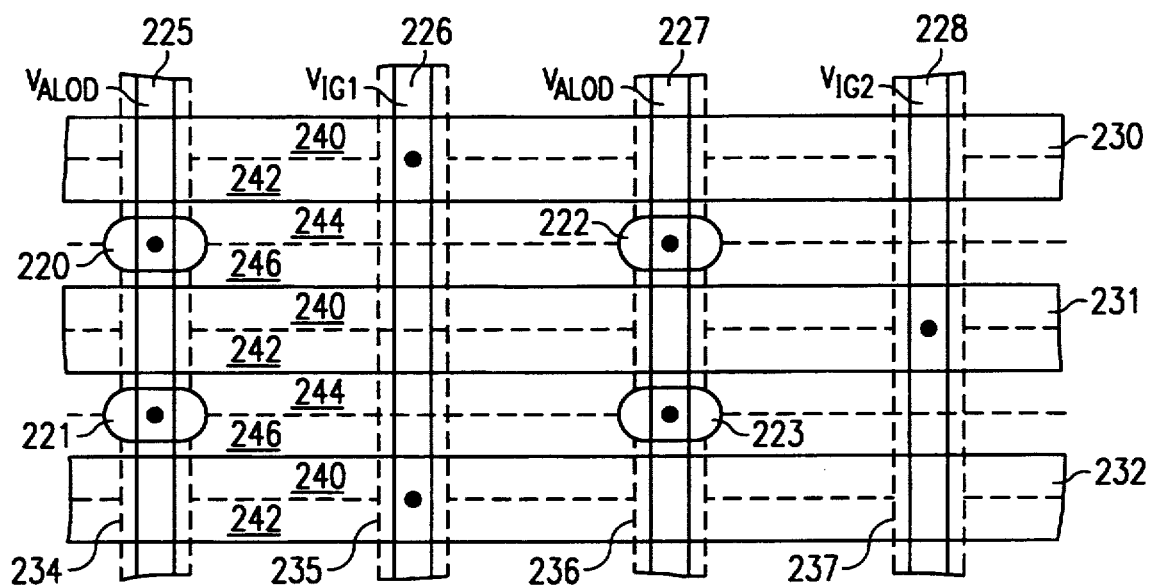
FIG. 9 is an enlarged schematic plan view of a portion of the high quantum efficiency bussing of the clocked electrodes of the device of FIG. 1.

The virtual phase architecture of the preferred embodiment also allows a simple, high quantum efficiency bussing of clocked electrodes as well as the ALOD, as shown in FIG. 9. The device in FIG. 9 includes advanced lateral overflow drains 220–223, busses 225–228, photosite gates 230–232, channel stop regions 234–237, clocked barriers 240, clocked wells 242, virtual barriers 244, and virtual wells 246. The busses 225–228 are over the channel stop regions 234–237 to minimize the impact on the device modulation transfer function (MTF). This also decreases color cross talk when stripe or checker board on chip color filters are used.

The image sensing area 22 is coupled to three clock signals, $V_{ALOD}$, $V_{IG1}$, and $V_{IG2}$, shown in FIG. 9. $V_{ALOD}$ goes to the lateral overflow drains. $V_{IG1}$ is coupled to the gate electrodes of field "A". $V_{IG2}$ is coupled to the gate electrodes of field "B". By using in-phase clocking of $V_{IG1}$ and $V_{IG2}$, charge sensed during an integration period can be transferred down columns to the memory area 24. For charge clearing operations, $V_{IG1}$ and $V_{IG2}$ are held at a low voltage while $V_{ALOD}$ is clocked to a high voltage. During charge integration periods, $V_{ALOD}$ is held at a lower voltage than during charge clearing operations to create an anti-blooming barrier and drain.

Memory area 24 may be fabricated with the virtual phase CCD device described above and clocked in phase, although the virtual phase devices described in applicant's U.S. Pat. No. 4,229,752, and entitled "Virtual Phase Charge Transfer Device", issued Oct. 21, 1980 and incorporated herein by reference will work perhaps more efficiently, as the memory phase area is not exposed to incident light and it is therefore unnecessary to provide either the charge clearing mechanism or the antiblooming gate mechanism to the devices in this area. Therefore, the memory area 24 of the preferred embodiment, shown in FIG. 1, requires only one clock signal, $V_{MAG}$.

In operation, a sensed image is transferred from the image sensing array 22 to the memory area array 24 during the vertical blanking period. Due to metal bussing, it is also possible to transfer the signal to memory during the horizontal blanking interval if desired. In the preferred embodiment which meets the NTSC standard, it is required that this transfer is not longer than approximately one millisecond. Once the vertical blanking period ends, the image sensing area 22 is placed in integration mode. During extremely short integration times it is possible that image clearing, integration, and transfer to memory can all be accomplished in the vertical blanking period. During integration, the voltages $V_{IG1}$ and $V_{IG2}$ are left at low levels, and the voltage $V_{ALOD}$ is at a lower voltage for the antiblooming feature than for the charge clearing feature.

The serial registers 26 and 28 each receive a single row of charge from the memory area 24, which is transferred out by clocking the voltage $V_{SRG}$ to shift the charge to the charge detection amplifiers 30 and 32. In the serial registers 26 and 28 of FIG. 1, charge is transferred from the right side to the left side responsive to the clocking of voltage input $V_{SRG}$. Once the horizontal update is completed, two new rows are clocked into the serial registers 26 and 28, and the image sensing array 22 can be cleared of charge, if desired, by clocking $V_{ALOD}$ to a high voltage, as described above, for electronic exposure control. During the next horizontal line update, additional charge will be sensed by the image sensing array 22, so that there is always enough image data in the image sensing array 22, but at the same time no overexposure occurs due to an overlong integration period. The image integration time can now be varied by selecting in which horizontal blanking period the image has been cleared. This process provides an electronic exposure control.

The cycle continues until the entire memory array gate area 24 has been transferred, two rows at a time, to the serial registers 26 and 28, and shifted out through the charge detection amplifiers 30 and 32. The next vertical blanking period will then occur, which permits the transfer of the integrated image data from the image sensing area 22 into the memory area 24.

Several advantages are provided by the preferred embodiment. One advantage is the simple architecture which includes a split phase image sensing area, dual serial registers, interdigitized electrode bussing, and ALOD blooming control. A second advantage is the small number of clock lines. A third advantage is the multimode operation which includes single pulse image clear, charge summing in the image area prior to transfer to memory, smear subtraction, electronic exposure control, two line readout, and high resolution for color. A fourth advantage is the high sensitivity detection node. A fifth advantage is the small pixel format ⅓ inch equivalent. A sixth advantage is the high parallel transfer rate and minimal smear achieved by using metal interdigitated electrode bussing.

A few preferred embodiments have been described in detail hereinabove. It is to be understood that the scope of the invention also comprehends embodiments different from those described, yet within the scope of the claims. Words of inclusion are to be interpreted as non-exhaustive in considering the scope of the invention.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An imager comprising:
    a frame transfer image array having a plurality of image cells, the image cells accumulating charge in response to input light and arranged in a plurality of image rows and image columns, odd numbered ones of the image rows constituting a first field and even numbered ones of the image rows constituting a second field; and
    a memory array for storing charge from the image array, wherein, in a first mode, charge in the first field and the second field is transferred to the memory array from the image array, and, in a second mode, charge in the first field is summed with charge in the second field in the image array before being transferred to the memory array.

2. The device of claim 1 further comprising a first serial register coupled to the memory array output.

3. The device of claim 2 further comprising a second serial register coupled to a parallel output of the first serial register.

4. The device of claim 3 further comprising a charge clearing drain coupled to a parallel output of the second serial register.

5. The device of claim 3 further comprising a first charge detection node coupled to a serial output of the first serial register and a second charge detection node coupled to a serial output of the second serial register.

6. The device of claim 5 further comprising a first charge detection amplifier coupled to an output of the first charge detection node and a second charge detection amplifier coupled to an output of the second charge detection node.

7. The device of claim 3 wherein, in the second mode, smear information is read out simultaneously with corresponding image signal information.

8. The device of claim 3 wherein smear information is read out from the first serial register simultaneously with corresponding image signal information which is read out from the second serial register.

9. The device of claim 1 wherein the columns in the image array comprise a plurality of serially connected charge coupled device cells.

10. The device of claim 9 wherein the charge coupled device cells comprise even clocked gates, odd clocked gates spaced apart from the even clocked gates, and virtual gates between the odd and even clocked gates.

11. The device of claim 10 wherein the charge coupled device cells are coupled to lateral overflow drains.

12. The device of claim 11 wherein channel stop regions isolate the columns in the image array.

13. The device of claim 12 wherein odd clocked gate buss lines, even clocked gate buss lines, and lateral overflow drain buss lines overlie the channel stop regions.

14. The device of claim 1 wherein a portion of the image cells are shielded from input light.

15. The device of claim 1 further comprising a color filter in the image array.

* * * * *